United States Patent [19]

Dijkmans et al.

[11] Patent Number: 4,688,001
[45] Date of Patent: Aug. 18, 1987

[54] HIGH EFFICIENCY, LOW DISTORTION AMPLIFIER

[75] Inventors: Eise C. Dijkmans; Joseph G. G. Raets, both of Eindhoven, Netherlands; Norbert J. L. Philips, Louvain, Belgium

[73] Assignee: U.S. Philips Corporation, New York, N.Y.

[21] Appl. No.: 838,966

[22] Filed: Mar. 11, 1986

[30] Foreign Application Priority Data

Mar. 18, 1985 [NL] Netherlands ........................ 8500769

[51] Int. Cl.⁴ .............................................. H03F 3/30
[52] U.S. Cl. .................................. 330/273; 330/156; 330/297
[58] Field of Search .............. 330/156, 202, 267, 273, 330/297, 296

[56] References Cited

U.S. PATENT DOCUMENTS 3,961,280 6/1976 Sampei ............................ 330/297 X

*Primary Examiner*—James B. Mullins
*Attorney, Agent, or Firm*—Robert T. Mayer; Bernard Franzblau

[57] ABSTRACT

A high efficiency class-G amplifier comprises first (2), second (4) and third (10) terminals connected to a load, a first ($V_1$) and second ($V_2$) supply voltage, respectively, where voltage $V_2 > V_1$. First ($T_1$) and second ($T_2$) transistors are serially connected between the first and third terminals. A third transistor ($T_3$, emitter-follower) couples a signal input terminal (6) to the base of the first transistor. A first diode ($D_1$) connects the collector of $T_1$ to the second terminal. A driver circuit includes a current path between the third terminal and a common terminal (11) having, in series, a first current source (7), second ($D_2$) and third ($D_3$) diodes and a second current source (8). A fourth diode ($D_4$) connects junction point 3 to junction point 9. A fifth diode ($D_5$) connects the emitter of the third transistor to the second current source. A low input voltage cuts off the second transistor, which connects the first transistor to the first supply voltage via the first diode. At a given higher input voltage, the driver circuit drives the second transistor into conduction thereby coupling the first transistor to the second supply voltage. The output (2) thus can reach a voltage equal to the second supply voltage ($V_2$) minus one B/E voltage.

16 Claims, 7 Drawing Figures

HIGH EFFICIENCY, LOW DISTORTION AMPLIFIER

BACKGROUND OF THE INVENTION

This invention relates to an amplifier arrangement, comprising
- a first transistor having an emitter which is coupled to a first terminal for connection to a load which is coupled to a reference point, and having a collector which is coupled by means of a first semiconductor junction to a second terminal for a first supply voltage,
- a second transistor having a collector-emitter path which is arranged in series with the collector-emitter path of the first transistor, and having a collector which is coupled to a third terminal for a second supply voltage which is higher than the first supply voltage, and
- a third transistor arranged as an emitter-follower and having a base for receiving an input signal and having an emitter which is coupled to the base of the first transistor.

The invention also relates to a push-pull amplifier equipped with such an amplifier arrangement.

Such an amplifier arrangement of the class-G type may be employed as a power amplifier for audio signals. A class-G amplifier is to be understood to mean an amplifier in which the supply voltage increases in a number of steps dpending on the input signal. This results in an amplifier having a high efficiency.

Such an amplifier arrangement is disclosed in U.S. Pat. No. 3,961,280. In this known arrangement the input signal is applied to the bases of the first transistor and the second transistor via a third transistor arranged as an emitter follower. For low input voltages the second transistor is cut off so that the first transistor is connected to the first supply voltage. If the input voltage becomes higher than the first supply voltage, the second transistor is turned on so that the first supply voltage is disconnected and the first transistor is connected to the second supply voltage.

When the second transistor does not conduct, the voltage across the base-emitter junction of this transistor is at the most equal to substantially the full first supply voltage. In order to preclude breakdown of the base-emitter junction as a result of this voltage, a diode is arranged in the base line of the second transistor. In order to prevent the final transistor from being bottomed and thereby producing distortion when the second transistor is not yet fully conductive, two series-connected diodes are arranged in the base line of the first transistor.

However, a drawback of these diodes is that they limit the swing of the output signal and consequently, the efficiency of the amplifier arrangement. For the maximum output the voltage on the base of the third transistor is substantially equal to the second supply voltage. The voltage on the output is then equal to the second supply voltage minus the sum of the base-emitter voltages of the first transistor and the third transistor and the diode voltage across the two diodes arranged in the base line of the first transistor.

SUMMARY OF THE INVENTION

It is an object of the invention to provide a class-G-type amplifier arrangement which has an improved output-voltage swing in comparison with the known arrangement. In accordance with the invention an amplifier arrangement of the type defined in the opening paragraph is characterized in that a current path is arranged between the third terminal and the reference point, which current path comprises the series arrangement of at least a first current source, a second semiconductor junction, a third semiconductor junction and a second current source,
- by means of a fourth semiconductor junction the collector of the first transistor is connected to a point on the current path which is situated between the first current source and the second current source,
- the emitter of the third transistor is connected to the second current source by means of a fifth semiconductor junction, and
- the base of the second transistor is connected to the first current source.

In such an amplifier arrangement it is possible to drive the output to a voltage equal to the second supply voltage minus the sum of one base-emitter voltage and two saturation voltages, which yields a substantially improved output voltage swing and hence a substantially improved efficiency. The amplifier arrangement also has the advantage that it can be fully integrated.

In an amplifier arrangement in accordance with the invention, the first transistor and the second transistor are each preferably constituted by a Darlington pair. The maximum output voltage swing is then one base-emitter voltage lower than in the case of single first and second transistors. In this case the maximum output voltage swing can be increased by one base-emitter voltage by bootstrapping. In accordance with a further embodiment the amplifier arrangement may then be characterized in that the first current source is connected to the third terminal by means of a first resistor and in that by means of a capacitor the first terminal is connected to that end of the first resistor which is not connected to the third terminal.

An amplifier arrangement in accordance with a further embodiment of the invention may be characterized in that the fifth semiconductor junction is the base-emitter junction of a fourth transistor arranged as an emitter follower. This precludes the occurrence of distortion as a result of a sudden decrease in the input resistance of the arrangement when the second transistor is turned on.

An amplifier arrangement in accordance with the invention is very suitable for use in push-pull amplifier, which comprises two complementary amplifier arrangements in which the emitters of the complementary first transistors are connected to a common first terminal for connection to a common load.

BRIEF DESCRIPTION OF THE DRAWINGS

Embodiments of the invention will now be described in more detail, by way of example, with reference to the accompanying drawings, in which.

DESCRIPTION OF THE PREFERRED EMBODIMENTS

Figure 1:
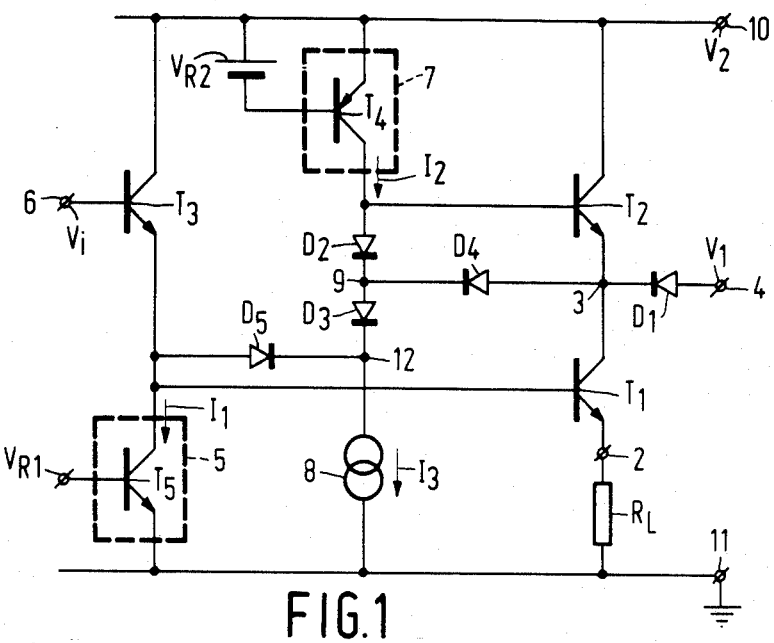
FIG. 1 is the basic diagram of an amplifier arrangement in accordance with the invention.

FIG. 1 shows the basic diagram of an amplifier arrangement in accordance with the invention. The arrangement comprises a first NPN transistor $T_1$, whose emitter is connected to the output 2, i.e. to a first terminal to which a load $R_L$ is connected. By means of a diode $D_1$ the collector of the transistor $T_1$ is connected to a second terminal 4 for a first supply voltage $V_1$. The collector-emitter path of a second NPN transistor $T_2$ is arranged in series with the collector-emitter path of the transistor $T_1$ and the collector of the transistor $T_2$ is connected to a third terminal 10 for a second supply voltage $V_2$ which is higher than the first supply voltage $V_1$. The base of the transistor $T_1$ is connected to the emitter of a (third) PNT transistor $T_3$, arranged as an emitter follower, whose emitter is connected to the terminal 11, which is a common reference point to the first supply voltage $V_1$ and the second supply voltage $V_2$, by means of a first current source 5. The current source 5, which carries a current $I_1$, comprises a transistor $T_5$ whose base is at a reference voltage $V_{R1}$. The collector of the transistor $T_3$ is connected to the second supply voltage $V_2$. The input signal $V_i$ is applied to the base 6 of the transistor $T_3$. A first current path is arranged between the terminal 10 for the supply voltage $V_2$ and the common terminal 11 and comprises the series arrangement of a second current source 7, supplying a current $I_2$, a second diode $D_2$, a third diode $D_3$, and a third current source 8 carrying a current $I_3$. The second current source 7 comprises a PNP transistor $T_4$ whose base is at a reference voltage $V_{R2}$. The current $I_3$ carried by the current source 8 is larger than the current $I_2$ supplied by the current source 7. The junction point 3 between the collector of the transistor $T_1$ and the emitter of the transistor $T_2$ is connected to the cathode of the diode $D_2$ by means of a diode $D_4$. The emitter of the transistor $T_3$ is connected to the cathode 12 of the diode $D_3$ by means of a diode $D_5$.

The arrangement operates as follows. For low input voltages $V_i$ the current $I_2$ from the current source 7 flows to the current source 8 via the diodes $D_2$ and $D_3$. The difference between the currents $I_3$ and $I_2$ is derived from the first supply voltage $V_1$ via the diodes $D_4$ and $D_1$. In this situation the diode $D_5$ is cut off. The voltage between the base and the emitter of the transistor $T_2$ is substantially 0 V because this voltage is equal to the difference between the voltages across the diodes $D_2$ and $D_4$. Consequently, the transistor $T_2$ is cut off so that for low input voltages the collector of the transistor $T_1$ is connected to the power supply $V_1$ via the diode $D_1$. The input signal $V_i$ is applied to the base of the transistor $T_1$ via the emitter-follower transistor $T_3$. This input signal $V_i$ also appears at the anode of the diode $D_5$. The voltage on the cathode 12 of the diode $D_5$ is three diode voltages lower than the supply voltage $V_1$. Therefore, the diode $D_5$ is turned on for a specific input voltage $V_i$. A part of the input voltage $V_i$ then appears on the cathode of the diode $D_1$. As the input voltage increases further the diode $D_4$ will become less conductive so that the current through the diode $D_4$ decreases and that through the diode $D_5$ increases. Above a specific input voltage $V_i$ the diode $D_4$ is turned off. The voltage on the base of the transistor $T_2$ follows the input voltage $V_i$ via the diodes $D_2$, $D_3$ and $D_5$. As this input voltage increases further the transistor $T_2$ is therefore turned on so that the voltage at the junction point 3 also increases. At a specific input voltage the diode $D_1$ is cut off so that the collector of the transistor $T_1$ is connected to the high supply voltage $V_2$ via the collector-emitter path of the transistor $T_2$. As the input voltage increases further the transistor $T_4$ will be bottomed so that the voltage on the base of the transistor $T_2$ cannot increase any further. If the base of the transistor $T_3$ is driven from a current source the voltage on the base of the transistor $T_3$ can be driven to the value of the second supply voltage minus the saturation voltage of this current source. Transistor $T_1$ is then not saturated. The maximum voltage $V_o$ on the output 2 is then equal to:

$$V_{0MAX} = V_2 - (V_{CES5} + V_{BET3} + V_{BET1}) \quad (1)$$

where $V_{CES5}$ = the collector-emitter voltage in the case of saturation of the drive current source of the transistor $T_3$, $V_{BET3}$ = the base-emitter voltage of the transistor $T_3$, and $V_{BET1}$ = the base-emitter voltage of the transistor $T_1$.

The voltage $V_{CES5}$ is approximately 100 mV so that the output 2 can be driven to a voltage substantially equal to the second supply voltage minus two base-emitter voltages ($\approx 1.2$ V) which, compared with the known amplifier arrangement, results in an output voltage swing which is substantially two diode voltages better.

If the voltage on the base of the transistor $T_3$ can exceed the second supply voltage $V_2$, for example as a reult of bootstrapping, the transistor $T_1$ can be bottomed, causing the diodes $D_2$ and $D_3$ to be cut off. The maximum output voltage is then reached. The voltage $V_0$ on the output 2 is now equal to:

$$V_{0MAX} = V_2 - (V_{CEST4} + V_{BET2} + V_{CEST1}) \quad (2)$$

where $V_{CEST4}$ = the collector-emitter voltage of the transistor $T_4$ during saturation, $V_{CEST1}$ = the collector-emitter voltage of the transistor $T_1$ during saturation, and $V_{BET2}$ = the base-emitter voltage of the transistor $T_2$.

As the voltage $V_{CEST4}$ and $V_{CEST1}$ are substantially 100 mV, it follows from the above equation that the output 2 can be driven to the value of the second supply voltage $V_2$ minus substantially one base-emitter voltage ($\approx 0.6$ V). As a result of this large output voltage swing the amplifier arrangement has a high efficiency.

Figure 2:
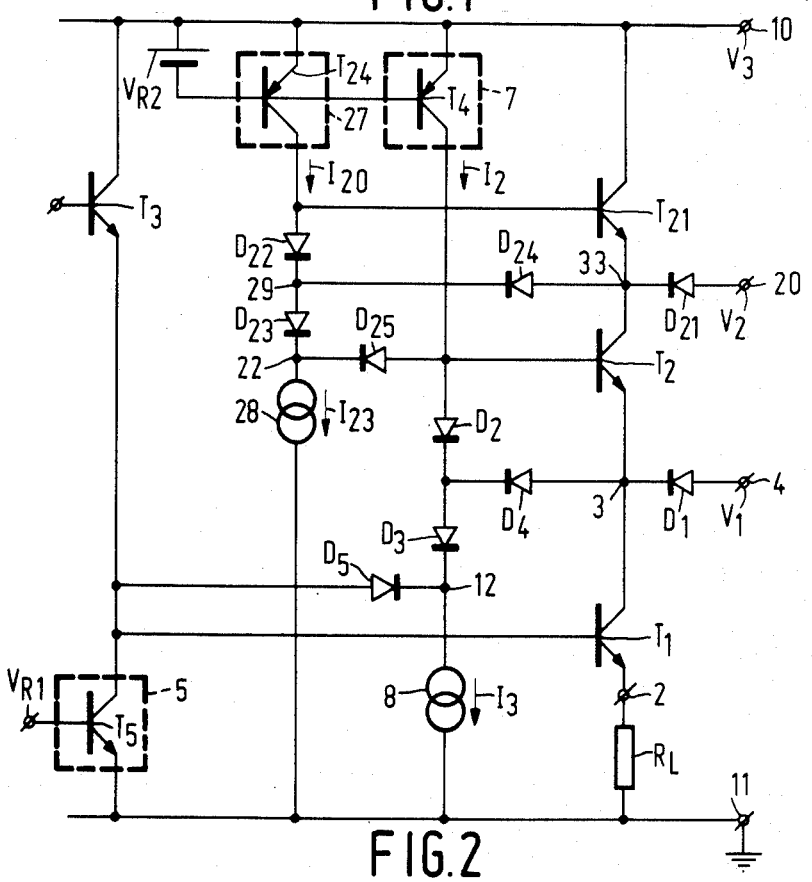
FIG. 2 shows an amplifier arrangement derived from the arrangement of FIG. 1.

The principle of two supply voltages as explained with reference to FIG. 1 may be extended to an arbitrary number of supply voltages. FIG. 2 shows an amplifier arrangement with three supply voltages, in which Figure identical parts bear the same reference numerals as in FIG. 1. A transistor $T_{21}$ has its collector-emitter path connected in series with the collector-emitter path of the transistor $T_2$ and has its collector connected to a third supply voltage $V_3$. The collector of the transistor $T_2$ is now connected to the second supply voltage $V_2$ via a diode $D_{21}$ and the current source 7 is connected to the third supply voltage $V_3$. The driver circuit for the transistor $T_{21}$ is of the same type as that for the transistor $T_2$. A current source 27 supplying a current $I_{20}$ is arranged between the third power supply voltage $V_3$ and the base of the transistor $T_{21}$. This current source 27 comprises a transistor $T_{24}$ whose base is at a reference voltage $V_{R2}$. The base of the transistor $T_{21}$ is connected to the common terminal 11 by the series arrangement of a diode $D_{22}$, a diode $D_{23}$ and a current source 28. A diode $D_{24}$ is arranged between junction point 33 of the emitter of the transistor $T_{21}$ and the collector of the transistor $T_2$ and the junction point 29 of the diode $D_{22}$ and the diode $D_{23}$. The base of the transistor $T_2$ is connected to the junction point 22 of the diode $D_{23}$ and the current source 28 by means of the diode $D_{25}$.

The operation of the circuit arrangement can be explained very simply by means of the principle described with reference to FIG. 1. For low input voltages $V_i$ the transistor $T_1$ is coupled to the first supply voltage $V_1$. The transistors $T_2$ and $T_{21}$ and the diodes $D_5$ and $D_{25}$ are cut off. The current $I_{20}$ from the current source 27 flows to the current source 28 via the diodes $D_{22}$ and $D_{23}$. The current $I_{23}$ carried by the current source 28 is derived from the supply voltage $V_2$ via the diodes $D_{21}$ and $D_{24}$. At increasing input voltages $V_i$ the diode $D_5$ and subsequently the transistor $T_2$ is driven into conduction and the first supply voltage $V_1$ is disconnected and the collector of the transistor $T_1$ is coupled to the supply voltage $V_2$. At a further increase of the input voltage $V_i$ the diode $D_{25}$ is turned on. As a result of this, the transistor $T_{21}$ is turned on and the diode $D_{24}$ is turned off so that, above a specific input voltage, the second supply voltage $V_2$ is disconnected and the collector of the transistor $T_1$ is coupled to the third supply voltage $V_3$. As the input voltage $V_i$ increases further the transistor $T_{24}$ is bottomed. The voltage on the base of the transistor $T_{21}$ then cannot increase any further. If the input voltage $V_i$ increases still further, the transistor $T_2$ is bottomed and the diodes $D_{22}$ and $D_{23}$ are cut off. If the base of the transistor $T_3$ can be driven to the third supply voltage $V_3$ minus one saturation voltage, the maximum voltage on the output 2 is equal to:

$$V_{0MAX} = V_3 - (V_{CES8} + V_{BET3} + V_{BET1}) \quad (3)$$

At this maximum output voltage the transistor $T_1$ is not bottomed. If the voltage on the base can reach or exceed the value of the third supply voltage, the transistor $T_1$ is bottomed and the diodes $D_2$ and $D_3$ are cut off. The maximum voltage $V_0$ on the output 2 is then equal to:

$$V_{0MAX} = V_3 - (V_{CEST24} + V_{BET21} + V_{CEST2} + V_{CEST1}) \quad (4)$$

where $V_{CEST24}$ = the collector-emitter voltage f the transistor $T_{24}$ in the case of saturation.

Figure 3:
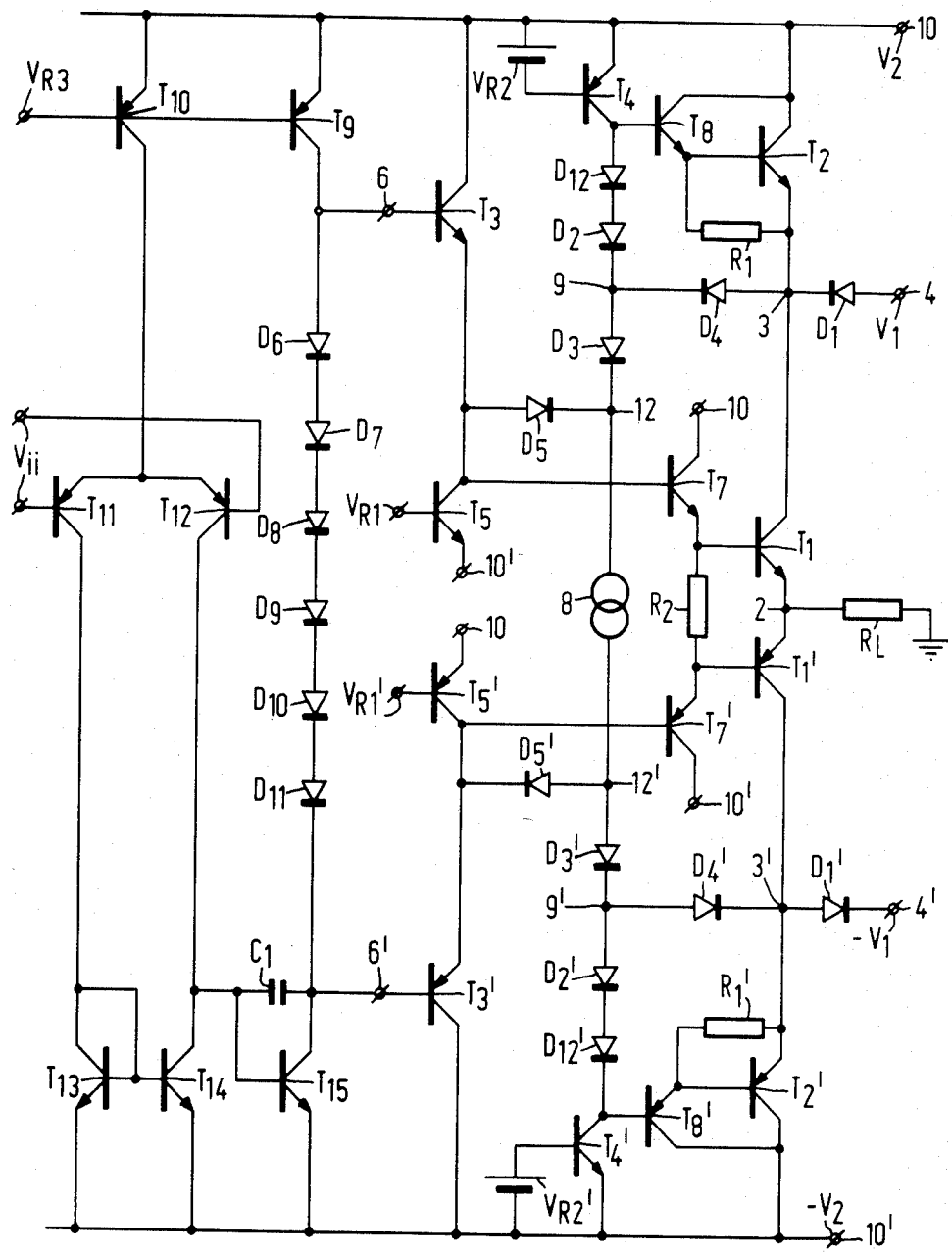
FIG. 3 shows a push-pull amplifier in accordance with a first embodiment of the invention.

The amplifier arrangement in accordance with the invention is very suitable for use in a push-pull amplifier, of which FIG. 3 shows a first embodiment. The push-pull amplifier comprises an input stage, which in the present embodiment has its simplest form and comprises two transistors $T_{11}$ and $T_{12}$ arranged as a differential pair, whose common emitter terminal is connected to the positive second supply voltage $+V_2$ by means of a current source comprising a transistor $T_{10}$ whoe base is at a reference voltage $V_{R3}$. The input signal $V_{ii}$ of the push-pull amplifier is applied between the bases of the transistors $T_{11}$ and $T_{12}$. The collector of the transistor $T_{12}$ is connected directly to the output of the input stage and the collector of the transistor $T_{11}$ is connected to the said output by means of a current mirror comprising the transistors $T_{13}$ and $T_{14}$, which output is connected to the input of a Miller stage. in the present example, this Miller stage comprises a transistor $T_{15}$ whose emitter is connected to the negative supply voltage $-V_2$. A frequency compensation capacitor $C_1$ is arranged between the collector and the base of this transistor $T_{15}$. The collector of the transistor $T_{15}$ is connected to the positive supply voltage $+V_2$ by the series arrangement of six diodes $D_6$, $D_7$, $D_8$, $D_9$, $D_{10}$ and $D_{11}$ and a current source comprising the transistor $T_9$, whose base is at the reference voltage $V_{R3}$. The output stage comprises two complementary circuits whuich are each substantially identical to the circuit arrangement shown in FIG. 1. Therefore, identical parts bear the same referece numerals as in FIG. 1, the complementary parts being denoted by primes. The arrangement differs from that shown in FIG. 1 with respect to the following points. The transistor $T_2$ and the transistor $T_8$ are arranged as a Darlington pair, a resistor $R_1$ being arranged between the base and the emitter of the transistor $T_2$ to provide a rapid turn-off of the Darlington pair. It is to be noted that a resistor or a diode may be arranged between the base and the emitter of the transistor $T_8$ for protection purposes, and in the case of a diode its forward direction should be opposite to that of the base-emitter junction of the transistor $T_8$. Similarly, the transistor $T_1$ forms a Darlington pair with a transistor $T_7$. An additional diode $D_{12}$ is arranged in series with the diodes $D_2$ and $D_3$. This diode $D_{12}$ ensures that change-over from the first to the second supply voltage is effected at the instant at which the Darlington pair $T_7$, $T_1$ is bottomed, so as to obtain an optimum drive of this pair. It is to be noted that the cathode of the diode $D_4$ may alternatively be connected to the anode of the diode $D_2$. The emitters of the complementary output transistors $T_1$ and $T_1'$ are connected to the common output 2 to which the load $R_L$ is connected. A resistor $R_2$ is arranged between the emitters of the transistors $T_7$ and $T_7'$ and has the same function as the resistors $R_1$. The current source 8 is a current source which is common to the two complementary circuits.

The emitters of the transistors $T_5$ and $T_5'$ are connected to the negative supply voltage $-V_2$ and the positive supply voltage $+V_2$, respectively. The output signal of the Miller stage is applied to the bases of the transistors $T_3$ and $T_3'$. The diodes $D_6$, $D_7$, $D_8$, $D_9$, $D_{10}$ and $D_{11}$ between the bases of the transistors $T_3$ and $T_3'$ provide a class-AB bias for the output stage. The push-pull principle is known per se and is therefore not explained here. Since the transistor $T_1$ and the transistors $T_7$ are arranged as a Darlington pair, the maximum output voltage swing is now equal to:

$$V_{0MAX} = +V_2 - (V_{CEST9} + V_{BET3} + V_{BET7} + V_{BET1}) \quad (5)$$

Consequently, the maximum output voltage is one base-emitter voltage lower than for the arrangement in FIG. 1. The minimum output voltage lies equally far above the negative supply voltage $-V_2$ as the maximum output voltage lies below the positive supply voltage $+V_2$. If the base of the transistor $T_3$ can be driven to such an extent that the base voltage exceeds the second supply voltage, the maximum output voltage is equal to:

$$V_{0MAX} = +V_2 = (V_{CEST4} + V_{BET8} + V_{BET2} + V_{CEST1}) \quad (6)$$

because the transistor $T_2$ is arranged as a Darlington transistor with the transistor $T_8$. Again the maximum output voltage is one base-emitter voltage lower than in the corresponding situation of FIG. 1.

Figure 4:
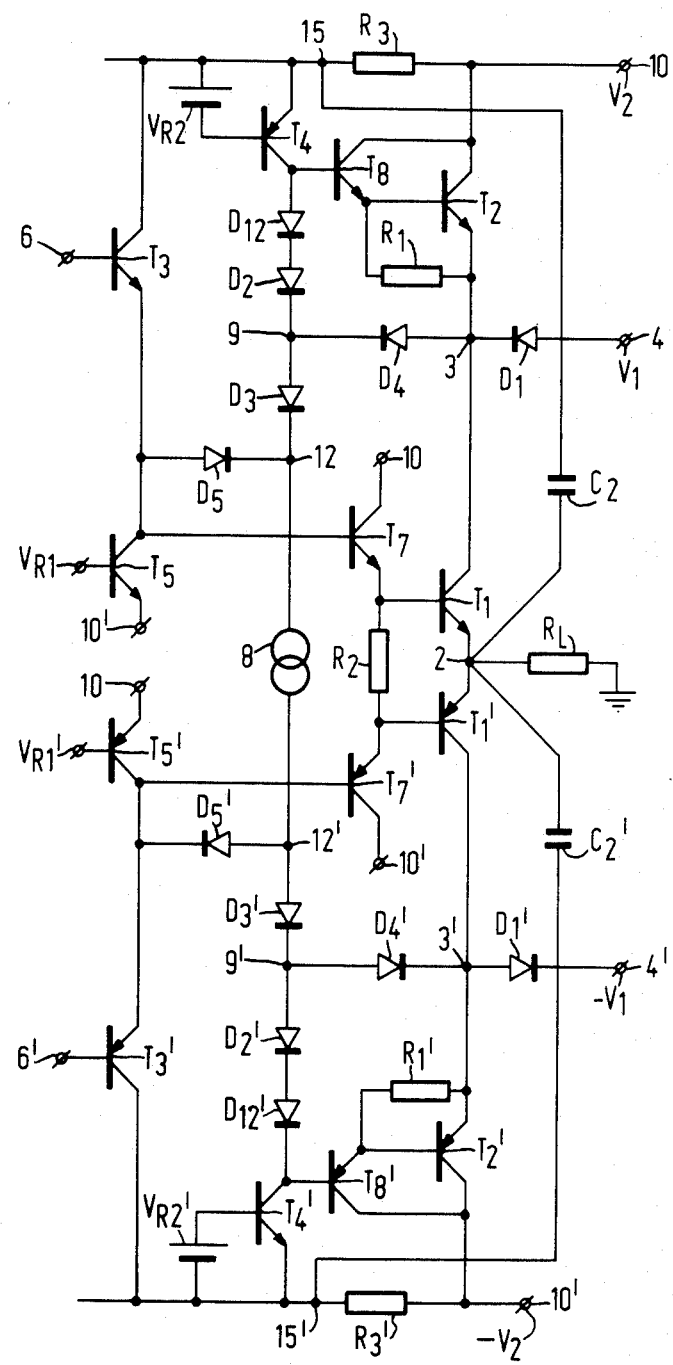
FIG. 4 shows a push-pull amplifier in accordance with a second embodiment of the invention.

A second example of a push-pull amplifier in accordance with the invention will be described with reference to FIG. 4. For simplicity only the output stage, which is relevant to the invention, is shown, and identical parts bear the same reference numerals as in FIG. 3. The emitter of the transistor $T_4$ is connected to the terminal 10 for the supply voltage $+V_2$ by means of a (first) resistor $R_3$. A capacitor $C_2$ is coupled between the output 2 and the end 15 of the resistor $R_3$. By means of the capacitor $C_2$ the output signal is bootstrapped so that the voltage on the collector of the transistor $T_4$ can be raised above the supply voltage $+V_2$. As far as the operation of the arrangement is concerned, this results in the saturation of the transistor $T_8$ instead of the transistor $T_4$ when the transistors $T_8$ and $T_2$ are turned on as a result of an increasing input signal. The collector of the transistor $T_8$ is now connected to the supply voltage $+V_2$ and, as a result of the bootstrapping, the base of the transistor $T_8$ can be driven beyond this supply voltage. Therefore, the maximum output voltage becomes equal to:

$$V_{0MAX} = V_2 - (V_{CEST8} + V_{BET2} + V_{CEST1}) \quad (7)$$

where $V_{CEST8}$ = the collector-emitter voltage of the transistor $T_8$ in the case of saturation.

This bootstrapping results in an increase of the maximum output voltage swing of the arrangement by one base-emitter voltage (see equation 6). It is to be noted that in the present embodiment the current-source transistor $T_{10}$ of the input stage (see FIG. 3) is connected directly to the positive second supply voltage $+V_2$ and the emitters of the transistors $T_{13}$, $T_{14}$ and $T_{15}$ are connected directly to the negative supply voltage $-V_2$.

A third embodiment of a push-pull amplifier will be described with reference to FIG. 5, in which identical parts bear the same reference numerals as in FIG. 4. In the present embodiment the current-source transistor $T_4$ is replaced by a resistor $R_4$. As a result of bootstrapping the same signal voltage appears on the base of the transistor $T_8$ as on point 15. Consequently, a constant voltage is obtained across this resistor so that the resistor $R_4$ operates as a current source.

Figure 5:
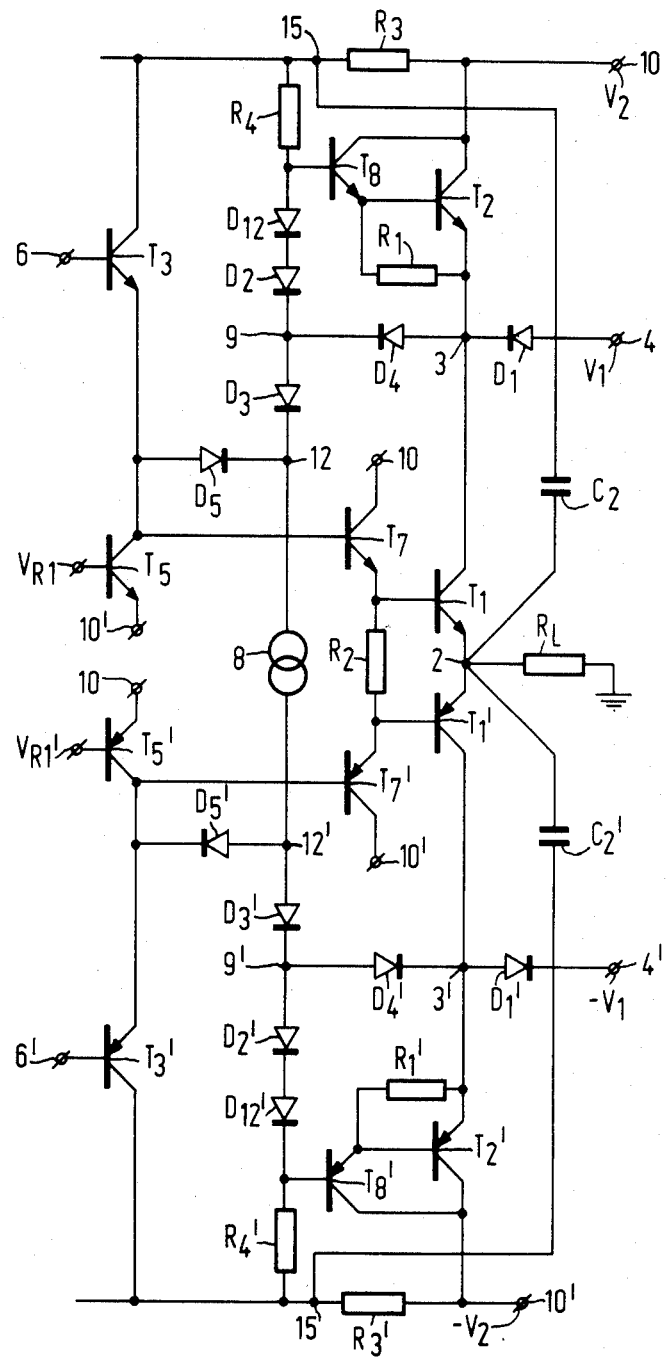
FIG. 5 shows a push-pull amplifier in accordance with a third embodiment of the invention.
Figure 6:
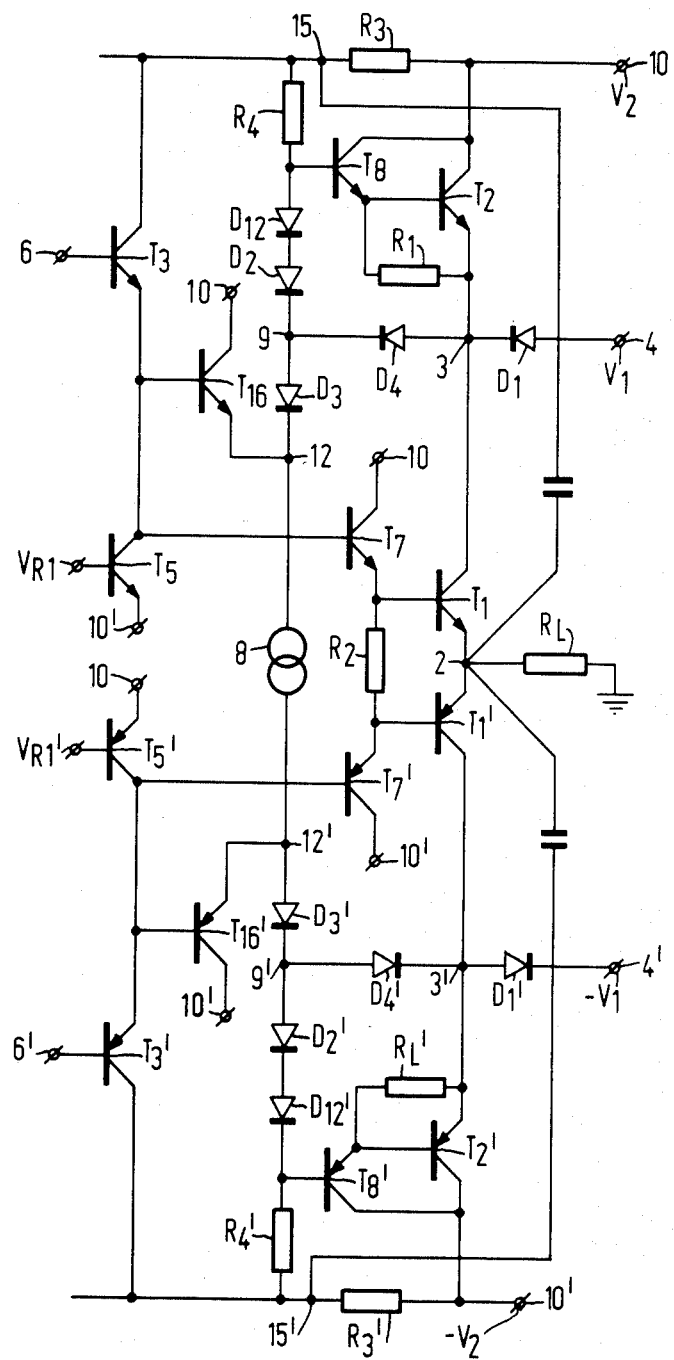
FIG. 6 shows a push-pull amplifier in accordance with a fourth embodiment of the invention.

FIG. 6 shows a push-pull amplifier in accordance with a fourth embodiment of the invention, and identical parts bear the same reference numerals as in FIG. 5. This embodiment differs from that shown in FIG. 5 in that the diode $D_5$ is replaced by an emitter-follower transistor $T_{16}$, whose emitter is connected to the cathode of the diode $D_3$, whose collector is connected to the positive supply voltage $+V_2$, and whose base is connected to the emitter of the transistor $T_3$. When, in the embodiment shown in FIG. 5, the transistors $T_8$, $T_2$ are turned on the resistance at the emitter of the transistor $T_3$ decreases suddenly, because the resistance which is seen at the base of the transistor $T_8$ is connected in parallel with the resistance which is seen at the base of the transistor $T_7$. This results in a sudden decrease of the input resistance of the arrangement, which leads to distortion of the input signal. By replacing the diode $D_5$ by a transistor $T_{16}$, the resistance which is connected in parallel with the input resistance of the transistor $T_7$ when the transistors $T_8$, $T_2$ are turned on is increased by a factor equal to the current-gain factor of the transistor $T_{16}$. Thus, when the transistors $T_8$, $T_2$ are turned on the decrease in the input resistance of the transistor $T_3$ is substantially smaller, so that the resulting distortion is also reduced substantially. It is to be noted that the emitter-follower transistor $T_{16}$ may also be used in the embodiments shown in FIGS. 1, 2, 3 and 4.

Figure 7:
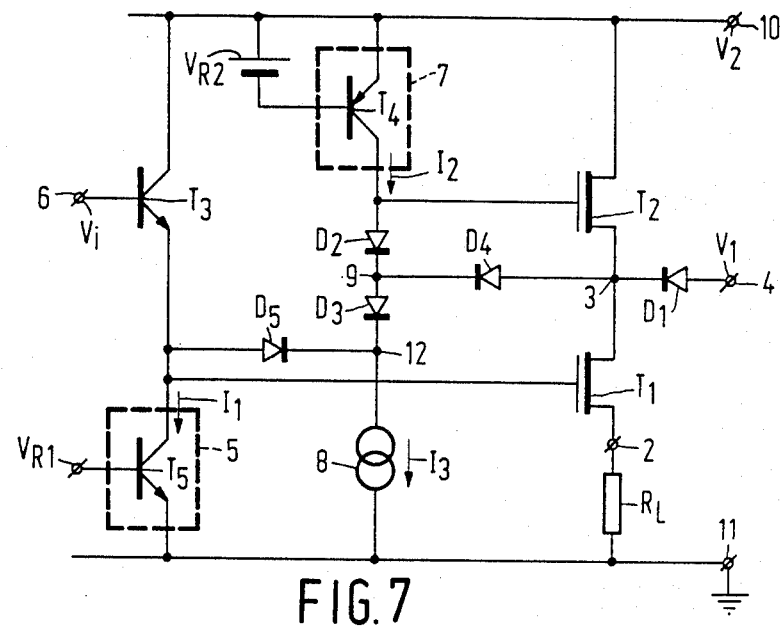
FIG. 7 shows an amplifier in accordance with a fifth embodiment of the invention.

The invention is not limited to the embodiments shown. Within the scope of the invention many modifications are obvious to those skilled in the art. For example, the diodes in the present embodiments may be replaced by diode-connected transistors. Further, all or some of the bipolar transistors in the arrangement may be replaced by MOS transistors, as shown, for example, in FIG. 7, in which case "emitter", "collector" and "base" should read: "source", "drain" and "gate", respectively. Further, the current sources 5 and 5' may be replaced by resistors. Finally, it is to be noted that the embodiments shown in FIGS. 3, 4, 5 and 6 may also be equipped with the amplifier arrangement shown in FIG. 2.

What is claimed is:

1. An amplifier arrangement, comprising
a first transistor having an emitter is coupled to a first terminal for connection to a load which is coupled to a reference point, and a collector is coupled by means of a first semiconductor junction to a second terminal for a first supply voltage,
a second transistor having a collector-emitter path connected in series with the collector-emitter path of the first transistor, and having a collector coupled to a third terminal for a second supply voltage which is higher than the first supply voltage, and
a third transistor arranged as an emitter-follower and having a base for receiving an input signal and having an emitter coupled to a base of the first transistor, characterized in that
a current path is coupled between the third terminal and the reference point, and comprises a series arrangement of at least a first current source, a second semiconductor junction, a third semiconductor junction and a second current source,
a fourth semiconductor junction connects the collector of the first transistor to a point on the current path situated between the first current source and the second current source,
the emitter of the third transistor is connected to the second current source by means of a fifth semiconductor junction, and
the base of the second transistor is coupled to the first current source.

2. An amplifier arrangement as claimed in claim 1, characterized in that the first transistor and the second transistor each comprise a Darlington pair.

3. An amplifier arrangement as claimed in claim 1, characterized in that the first current source is connected to the third terminal by means of a first resistor and a capacitor connects the first terminal to that end of the first resistor which is not connected to the third terminal.

4. An amplifier arrangement as claimed in claim 3, characterized in that the first current source comprises a second resistor.

5. An amplifier arrangement as claimed in claim 1, characterized in that the fifth semiconductor junction comprises a base-emitter junction of a fourth transistor connection as an emitter follower.

6. A push-pull amplifier comprising first, second and third terminals for connection to a load, a first supply voltage and a second supply voltage, respectively, said second supply voltage being higher than the first supply voltage, first and second transistors serially connected between the first and third terminals, a first semiconductor junction coupling the second terminal to a junction point between the first and second transistors, a third transistor connected as an emitter-follower and having a base for receiving an input signal and an emitter coupled to a control electrode of the first transistor, fourth and fifth terminals for connection to third and fourth supply voltages, respectively, of opposite polarity to said first and second supply voltages, respectively, and with the fourth supply votage being higher than the third supply voltage, fourth and fifth transistors serially connected between the fifth and first terminals, a sixth transistor connected as an emitter-follower and having a base for receiving said input signal and an emitter coupled to a control electrode of the fourth transistor, a current path coupled between the third and fifth terminals comprising a series arrangement of at least a first current source, second and third semiconductor junctions, and second and third current sources, a fourth semiconductor junction coupling a junction point between the first and second current sources to said junction point between the first and second transistors, a fifth semiconductor junction coupling the emitter of the third transistor to the second current source, a sixth semiconductor junction coupling the fourth terminal to a junction point between the fourth and fifth transistors, a seventh semiconductor junction coupling a junction point between the second and third current sources to the junction point between the fourth and fifth transistors, an eighth semiconductor junction coupling the emitter of the sixth transistor to the second current source, and means coupling a control electrode of the second transistor and a control electrode of the fifth transistor to said first and third current sources, respectively.

7. A push-pull amplifier as claimed in claim 6 further comprising first and second resistors coupling the first and third current sources to the third and fifth terminals, respectively, a first capacitor coupling the first terminal to a junction point between the first resistor and the first current source, and a second capacitor coupling the first terminal to a junction point between the second resistor and the third current source.

8. An amplifier as claimed in claim 6 wherein said first and second transistors are bipolar transistors of the same conductivity and the fourth and fifth transistors are bipolar transistors complementary to the first and second transistors, wherein the first transistor and the fourth transistor each has its emitter connected to the first terminal.

9. An amplifier comprising: first, second and third terminals for connection to a load, a first supply voltage and a second supply voltage, respectively, said second supply voltage being higher than the first supply voltage, first and second transistors serially connected between the first and third terminals, a first semiconductor junction coupling the second terminal to a junction point between the first and second transistors, a third transistor having a control electrode for receiving an input signal and a first main electrode coupled to a control electrode of the first transistor, a current path coupled to the third terminal and comprising a series arrangement of a first current source, second and third semiconductor junctions and a second current source, a fourth semiconductor junction coupling a junction point between the first and second current sources to said junction point between the first and second transistors, a fifth semiconductor junction coupling the first main electrode of the third transistor to the second current source and means connecting a control electrode of the second transistor to said first current source.

10. An amplifier as claimed in claim 9 further comprising a resistor coupling the first current source to the third terminal, and a capacitor coupling the first terminal to a junction point between the resistor and the first current source.

11. An amplifier as claimed in claim 9 wherein at least one of said transistors comprises a field effect transistor.

12. An amplifier as claimed in claim 9 wherein at least one of said transistors comprises a bipolar transistor.

13. An amplifier as claimed in claim 9 wherein said current path is connected between said third terminal and a reference point.

14. An amplifier as claimed in claim 13 wherein said first current source, said second and third semiconductor junctions and said second current source are connected in the order named between said third terminal and said reference point.

15. An amplifier as claimed in claim 14 wherein said junction point between the first and second current sources comprises a junction point between the second and third semiconductor junctions.

16. An amplifier as claimed in claim 9 wherein said first, second, third, fourth and fifth semiconductor junctions each comprise at least one diode.

* * * * *

UNITED STATES PATENT AND TRADEMARK OFFICE
CERTIFICATE OF CORRECTION

PATENT NO. : 4,688,001
DATED : August 18, 1987
INVENTOR(S) : Eise C. Dijkmans, et al It is certified that error appears in the above—identified patent and that said Letters Patent is hereby corrected as shown below:

IN THE CLAIMS

Claim 1, line 1,   delete ","

Claim 1, line 2,   delete "is"

Claim 1, line 4,   delete "is"

claim 5, line 4,   change "connection" to

--connected--

Signed and Sealed this

Twenty-fifth Day of October, 1988

*Attest:*

DONALD J. QUIGG

*Attesting Officer*       *Commissioner of Patents and Trademarks*